(12) United States Patent
Nakamura et al.

(10) Patent No.: US 12,046,870 B2
(45) Date of Patent: Jul. 23, 2024

(54) OPTICAL SEMICONDUCTOR DEVICE

(71) Applicant: Lumentum Japan, Inc., Sagamihara (JP)

(72) Inventors: Atsushi Nakamura, Nagano (JP); Shigetaka Hamada, Kanagawa (JP); Ryosuke Nakajima, Kanagawa (JP); Ryu Washino, Kanagawa (JP); Shoko Yokokawa, Kanagawa (JP); Kouji Nakahara, Tokyo (JP)

(73) Assignee: Lumentum Japan, Inc., Kanagawa (JP)

( * ) Notice: Subject to any disclaimer, the term of this patent is extended or adjusted under 35 U.S.C. 154(b) by 0 days.

(21) Appl. No.: 17/733,907

(22) Filed: Apr. 29, 2022

(65) Prior Publication Data

US 2023/0155347 A1 May 18, 2023

(30) Foreign Application Priority Data

Nov. 12, 2021 (JP) .................................. 2021-185154
Feb. 14, 2022 (JP) .................................. 2022-020198

(51) Int. Cl.
*H01S 5/00* (2006.01)
*H01S 5/024* (2006.01)
*H01S 5/042* (2006.01)
*H01S 5/22* (2006.01)
*H01S 5/223* (2006.01)

(52) U.S. Cl.
CPC .......... *H01S 5/024* (2013.01); *H01S 5/04256* (2019.08); *H01S 5/2205* (2013.01); *H01S 5/223* (2013.01); *H01S 5/2231* (2013.01); *H01S 5/2232* (2013.01); *H01S 5/22* (2013.01); *H01S 5/2214* (2013.01)

(58) Field of Classification Search
CPC .... H01S 5/024; H01S 5/04256; H01S 5/2205; H01S 5/223; H01S 5/2231; H01S 5/2232; H01S 5/22; H01S 5/2214
See application file for complete search history.

(56) References Cited

U.S. PATENT DOCUMENTS 7,496,124 B2* 2/2009 Kozaki ............... H01S 5/32341
372/39
2003/0128729 A1* 7/2003 Matsumura ............. H01S 5/227
372/46.01

(Continued)

FOREIGN PATENT DOCUMENTS

JP 2008-041850 A 2/2008
JP 2010-056147 A 3/2010

(Continued)

*Primary Examiner* — Kinam Park
(74) *Attorney, Agent, or Firm* — Harrity & Harrity, LLP

(57) ABSTRACT

An optical semiconductor device includes a substrate, a semiconductor multilayer which is formed on the substrate, and includes an optical functional layer, an insulating film formed on the semiconductor multilayer, and an electrode formed on a part of the insulating film. The insulating film covers the semiconductor multilayer except for a region in which the semiconductor multilayer and the electrode are electrically connected to each other. At least a part of a region of the insulating film that is overlapped with the electrode is thinner than a region of the insulating film that is not overlapped with the electrode.

20 Claims, 12 Drawing Sheets

(56) References Cited

U.S. PATENT DOCUMENTS

| | | | |
|---|---|---|---|
| 2006/0054906 A1* | 3/2006 | Inoue | B82Y 20/00 |
| | | | 257/89 |
| 2006/0078022 A1* | 4/2006 | Kozaki | H01S 5/32341 |
| | | | 372/43.01 |
| 2008/0181276 A1* | 7/2008 | Kawanaka | H01S 5/22 |
| | | | 438/39 |
| 2008/0304528 A1* | 12/2008 | Yamamoto | H01S 5/34333 |
| | | | 438/31 |
| 2010/0193805 A1 | 8/2010 | Jogan et al. | |
| 2012/0082178 A1* | 4/2012 | Tamanuki | H01S 5/18355 |
| | | | 372/46.012 |
| 2013/0208751 A1* | 8/2013 | Nakahara | H01S 5/12 |
| | | | 372/45.011 |
| 2018/0090910 A1* | 3/2018 | Nakahara | G02B 6/42 |
| 2020/0127438 A1* | 4/2020 | Bovington | H01S 5/0215 |
| 2021/0234333 A1 | 7/2021 | Nakamura et al. | |

FOREIGN PATENT DOCUMENTS

| | | |
|---|---|---|
| JP | 2010-177649 A | 8/2010 |
| JP | 2011-181584 A | 9/2011 |
| JP | 2012-080054 A | 4/2012 |
| JP | 2021-118345 A | 8/2021 |

\* cited by examiner

OPTICAL SEMICONDUCTOR DEVICE

CROSS-REFERENCE TO RELATED APPLICATIONS

The present application claims priority to Japanese patent applications JP2022-020198 filed on Feb. 14, 2022 and JP2021-185154 filed on Nov. 12, 2021, the contents of which are hereby incorporated by reference into this application.

TECHNICAL FIELD

The present disclosure relates generally to an optical semiconductor device.

BACKGROUND

An optical semiconductor device that is to be used for optical communication can include an optical functional layer that converts electricity into light or light into electricity. For example, a laser and an external modulator can include an optical functional layer that uses a multiple quantum well layer. In addition, in a light-receiving element, an optical functional layer can be formed of a semiconductor absorption layer. In many cases, the optical semiconductor device can include an electrode made of a metal in order to apply a voltage to the optical functional layer, wherein a part of the electrode is electrically and physically connected to a semiconductor layer. In addition, an optical semiconductor device can include an insulating film that is arranged on, for the purpose of protecting, a surface of the semiconductor layer on which a metal is not arranged.

SUMMARY

When an optical semiconductor device is driven, an optical functional layer and other semiconductor layers, electrodes, and the like of the optical semiconductor device generate heat. The generated heat degrades characteristics of the optical semiconductor device. For example, a continuous wave laser (CW laser) that outputs continuous light has optical output characteristics as its main characteristics. It is desired that an optical output be large, and under a same drive current, the optical output to increase as a temperature of the optical semiconductor device decreases. In an environment with a constant outside temperature, when heat generated by the optical semiconductor device is released to the outside in a large amount, an effective temperature of the optical semiconductor device is decreased, and the optical output is improved. In other optical semiconductor devices as well as the CW laser, it is important that heat generated by the optical semiconductor devices be released to the outside in a large amount.

As described above, an optical semiconductor device may include a metal electrode and an insulating film (protective film). The electrode may be made of a metal, and hence may have high thermal conductivity and may provide excellent heat dissipation. The insulating film may be an oxide film or a silicon nitride film. Compared to a semiconductor and a metal, those materials have low thermal conductivity, which may inhibit release of generated heat to the outside.

In addition, a connection region between the electrode and the semiconductor layer may be limited to a narrow region. For example, in an optical semiconductor device having a stripe structure, a contact point between the electrode and the semiconductor layer is limited to only the upper surface of the stripe structure. However, from the viewpoint of heat dissipation, the electrode extends to a region wider than the width of the stripe structure. In this case, in order to achieve insulation between the electrode arranged on a region other than the region on the stripe structure and the semiconductor layer, the above-mentioned insulating film is arranged.

Accordingly, the insulating film is widely arranged on the surface of the semiconductor layer except for a small partial region, and the electrode is arranged on the insulating film. Because of this, the wide insulating film is positioned in a path through which heat generated in the semiconductor layer is released to the outside. As a result, a heat dissipation amount is limited, which serves as a factor for degrading characteristics of the optical semiconductor device.

Some implementations disclosed herein solve the above-mentioned problem, and provide an optical semiconductor device that provides improved heat dissipation.

In some implementations, an optical semiconductor device includes: a substrate; a semiconductor multilayer which is formed on the substrate, and includes an optical functional layer; an insulating film formed on the semiconductor multilayer; and an electrode formed on a part of the insulating film, wherein the insulating film covers the semiconductor multilayer except for a region in which the semiconductor multilayer and the electrode are electrically connected to each other, and wherein at least a part of a region of the insulating film that is overlapped with the electrode is thinner than a region of the insulating film that is not overlapped with the electrode.

In some implementations, the optical semiconductor device provides excellent heat dissipation.

DETAILED DESCRIPTION

Figure 1:
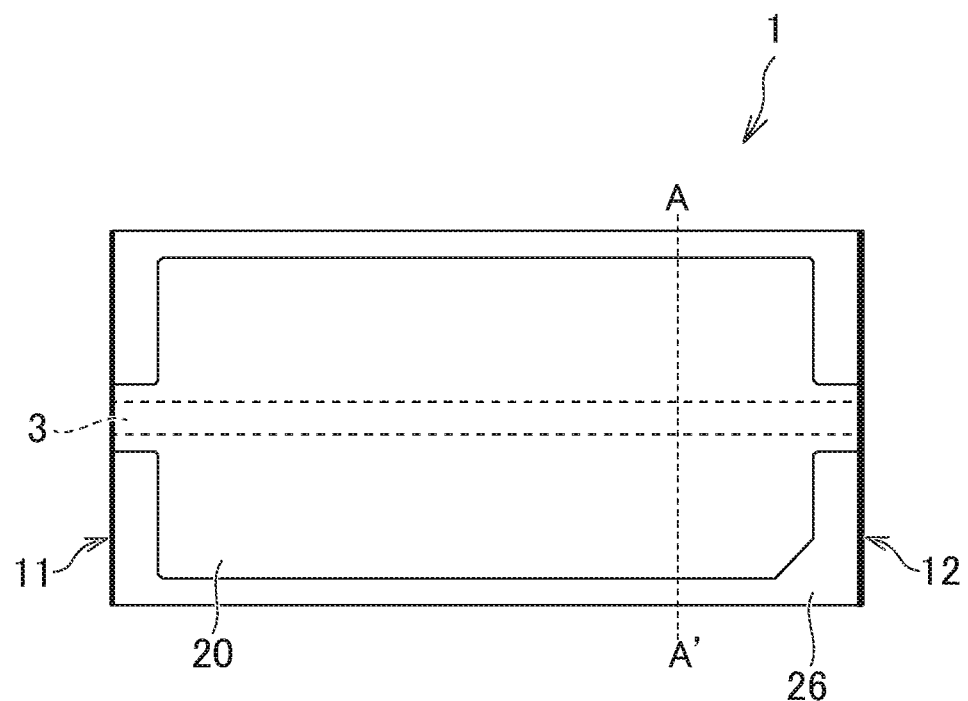
FIG. 1 is a top view of an example of an optical semiconductor device according to a first example implementation of the present invention.

Some implementations are specifically described in detail in the following with reference to drawings. In the drawings, the same members are denoted by the same reference numerals and have the same or equivalent functions, and a repetitive description thereof may be omitted for the sake of simplicity. Note that, the drawings referred to in the following are only for illustrating the example implementations, and are not necessarily drawn to scale.

Figure 2:
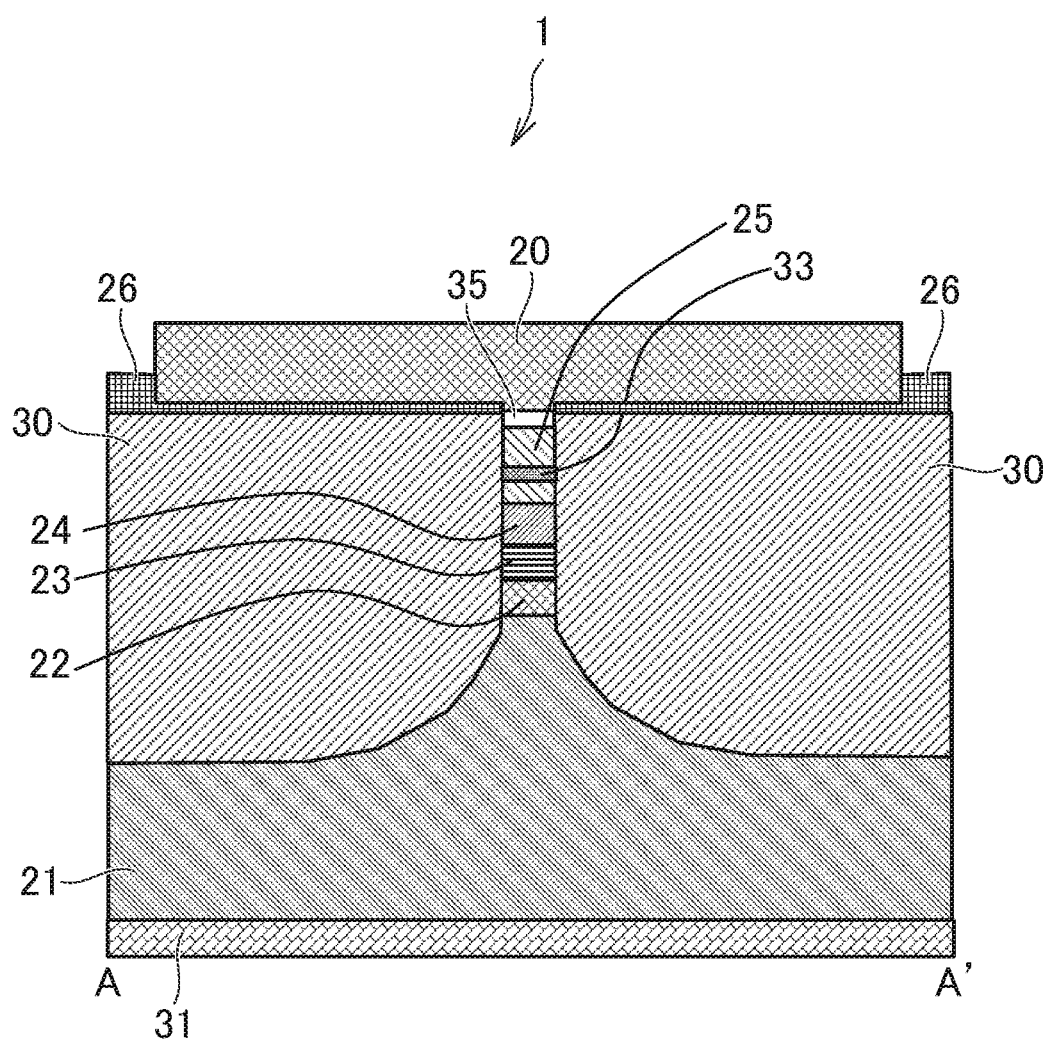
FIG. 2 is a schematic sectional view taken along the line A-A' of the optical semiconductor device illustrated in FIG. 1.

FIG. 1 is a top view of an optical semiconductor device 1 according to a first example implementation of the present invention. FIG. 2 is a schematic sectional view taken along the line A-A' of FIG. 1. Here, the optical semiconductor device 1 is an edge-emitting CW laser. The optical semiconductor device 1 may include a stripe structure 3. A top electrode 20 may be arranged on the surface of the optical semiconductor device 1. The top electrode 20 may be an electrode formed on a part of an insulating film 26, and is, for example, a metal film containing Au. The metal film may be formed of a plurality of materials. In addition, on the upper surface of the optical semiconductor device 1, the insulating film 26 may be arranged in a region other than the top electrode 20. The insulating film 26 may be arranged also under the top electrode 20 as illustrated in FIG. 2. The insulating film 26 is, for example, a silicon oxide film, a silicon nitride film, or an aluminum oxide film. The detail of the insulating film 26 may be described later. A low-reflection end face coating film 11 may be arranged on an end face on the left side of FIG. 1, and a high-reflection end face coating film 12 may be arranged on an end face on the right side of FIG. 1. The coating films may be merely examples, and the low-reflection end face coating films may be arranged on both the end faces.

As illustrated in FIG. 2, in the optical semiconductor device 1, the stripe structure 3 may be formed on a first conductivity type substrate 21. A buried layer 30 may be arranged on each side of the stripe structure 3. The buried layer 30 may be a semi-insulating semiconductor layer or a semiconductor layer in which a plurality of p-type and n-type semiconductor layers may be combined. The insulating film 26 may be arranged on the upper surface of the buried layer 30. The stripe structure 3 may be formed on a part of the substrate 21 so as to include a plurality of semiconductor layers. The plurality of semiconductor layers may be formed so as to include, from the bottom, a first conductivity type optical confinement layer 22, an active layer 23 (an optical functional layer) formed of a multiple quantum well layer, a second conductivity type optical confinement layer 24, a second conductivity type cladding layer 25, and a contact layer 35. A diffraction grating layer 33 may be formed in the middle of the second conductivity type cladding layer 25. The stripe structure 3 may or may not include a part of the substrate 21. The layers from the first conductivity type optical confinement layer 22 to the contact layer 35 may be hereinafter referred to as "semiconductor multilayer." In addition, in the first example implementation, the semiconductor multilayer may include the stripe structure 3 and the buried layer 30 formed on each side of the stripe structure 3. A rear electrode 31 may be arranged on the rear side of the substrate 21. In the first example implementation, the semiconductor multilayer may be a CW laser corresponding to a wavelength band of 1.3 micrometers. However, the implementations described herein may not be limited thereto, and the wavelength band of laser light output by the semiconductor multilayer may be another wavelength band. In addition, an insulating substrate may be used as the substrate 21. In this case, it may be required to arrange a first conductivity type semiconductor layer between the substrate 21, which may be an insulating substrate, and the stripe structure 3.

In some implementations, the insulating film 26 may cover the semiconductor multilayer except for a region in which the semiconductor multilayer and the top electrode 20 may be electrically connected to each other, and at least a part of a region of the insulating film 26 that is overlapped with the top electrode 20 may be thinner than a region of the insulating film 26 that is not overlapped with the top electrode 20. In the first example implementation, as illustrated in FIG. 2, the thickness of the insulating film 26 may be different between the region in which the top electrode 20 and the buried layer 30 are overlapped with each other and the region in which the top electrode 20 and the buried layer 30 are not overlapped with each other. The region of the insulating film 26 that is overlapped with the top electrode 20 may be thinner than the region of the insulating film 26 that is not overlapped with the top electrode 20.

In the optical semiconductor device 1, the active layer 23 may emit light when a voltage is applied (a current is injected) between the top electrode 20 and the rear electrode 31. The active layer 23 may also generate heat in addition to light emission. In addition, other semiconductor layers may also generate heat due to the flow of the current. The heat generated in the semiconductor multilayer may be released to the outside through the substrate 21 and the buried layer 30. In the optical semiconductor device 1 of the first example implementation, the stripe structure 3 may be formed on a top surface side of the substrate 21. For example, the distance from the top electrode 20 to the active layer 23 may be several micrometers, whereas the distance from the active layer 23 to the rear electrode 31 may be as thick as from tens of micrometers to 100 micrometers. Because of this, the generated heat may be released to an external environment in a larger amount on the top electrode 20 side as compared to the rear electrode 31 side. In addition, the heat generation amount becomes larger at a position closer to the active layer 23, and hence most of the generated heat may be released from the top electrode 20 side. A part of the heat may pass through the stripe structure 3 and may be released directly from the top electrode 20. However, besides the foregoing, as the heat dissipation path, there may be also a path leading to the top electrode 20 through the buried layer 30.

The insulating film 26 may be arranged between the top electrode 20 and the buried layer 30. The insulating film 26 may be a silicon oxide film, a silicon nitride film, an aluminum oxide film, or the like in which thermal conductivity may be smaller than that of the semiconductor multilayer as described above. Because of this, the insulating film 26 arranged between the top electrode 20 and the buried layer 30 may hinder heat dissipation. However, in the first example implementation, the insulating film 26 in the region that is overlapped with the top electrode 20 may be formed to be thin. The insulating film 26 in the region is, for example, may be 100 nanometers or less. Accordingly, heat may be released to the outside without significantly reducing heat dissipation.

Meanwhile, the insulating film 26 in the region that is not overlapped with the top electrode 20 may be set to hundreds of nanometers. When the thickness of the insulating film 26 in the region that is not overlapped with the top electrode 20 is set to be the same as the thickness of the region that is overlapped with the top electrode 20, there may be a risk in that the function of the insulating film 26 as a protective film in the region that is not overlapped with the top electrode 20 may not be sufficiently obtained, and there is a risk in that the reliability of the optical semiconductor device 1 may be influenced. In addition, in the region in which the top electrode 20 is arranged, the top electrode 20 functions as a protective film, and hence the reliability may not be substantially influenced even when the insulating film 26 is thinned.

With this configuration, an optical semiconductor device having excellent optical characteristics because of excellent heat dissipation may be provided while the reliability is ensured.

Figure 3:
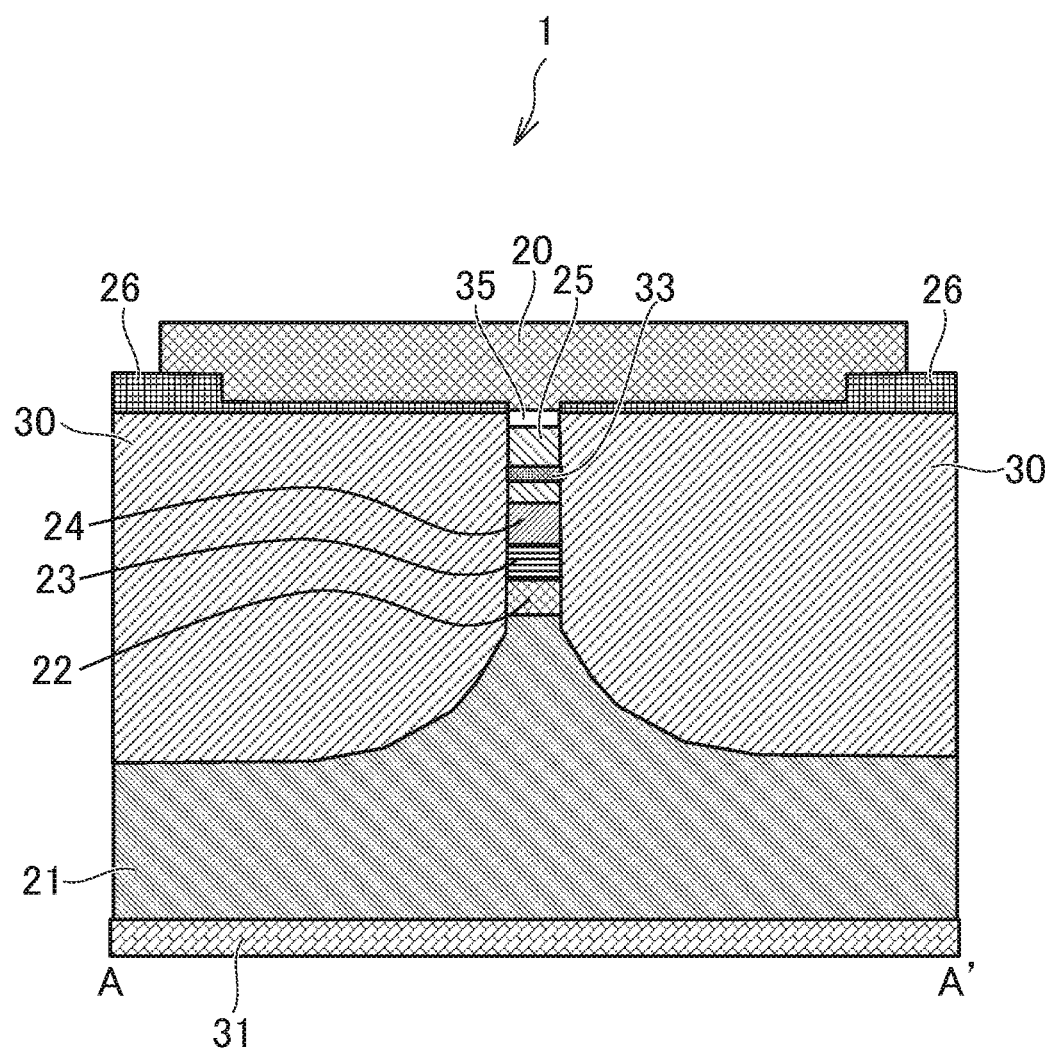
FIG. 3 is a schematic sectional view taken along the line A-A' of FIG. 1 of Modification Example 1 of the optical semiconductor device according to the first example implementation of the present invention.

FIG. 3 is a schematic sectional view taken along the line A-A' of FIG. 1 of Modification Example 1 of the optical semiconductor device 1. The difference from the foregoing is the shape of the insulating film 26. In Modification Example 1, the thickness of the insulating film 26 in the vicinity of each end portion of the top electrode 20 is larger than the thickness in the vicinity of the stripe structure 3. That is, a part of the thick region of the insulating film 26 is overlapped with a part of the end portion of the top electrode 20. This structure may be excellent from the viewpoint of manufacturability. In the manufacturing procedure of the optical semiconductor device 1, after the buried layer 30 and the semiconductor multilayer are formed and the insulating film 26 is arranged, the top electrode 20 may be arranged on the insulating film 26. In the foregoing, the end portion of the top electrode 20 and the boundary in which the thickness of the insulating film 26 is changed are matched with each other, but such matching may not be obtained due to manufacturing variations. In this case, for example, the top electrode 20 may not be overlapped with the thin region of the insulating film 26. As described above, when the insulating film 26 is thin, there may be a concern in that the reliability may be decreased. In order to avoid a structure in which the thin region of the insulating film 26 is not covered with the top electrode 20 due to the manufacturing variations, in Modification Example 1, the thickness of the insulating film 26 in the vicinity of the end portion of the top electrode 20 may be intentionally set to be the same as the thickness of the region that is not overlapped with the top electrode 20. With this configuration, the risk in that the thin region of the insulating film 26 may not be overlapped with the top electrode 20 may be reduced. Although Modification Example 1 may provide less heat dissipation as compared to the first example implementation, the influence may be small because the boundary in which the thickness is changed is the region away from the stripe structure 3. The position of the boundary in which the thickness of the insulating film 26 is changed may be determined in consideration of the manufacturing variations. Specifically, it may be desired that the region in which the thin insulating film 26 and the top electrode 20 are overlapped with each other be set to at least 50% or more of the area of the top electrode 20. In addition, it may be desired that the length in the A-A' cross-section of the region in which the thin insulating film 26 and the top electrode 20 are overlapped with each other be secured to be 10 micrometers or more on one side from the stripe structure. The length in the A-A' cross-section of the region in which the top electrode 20 and the thick insulating film 26 are overlapped with each other may be, for example, 3 micrometers.

Figure 4:
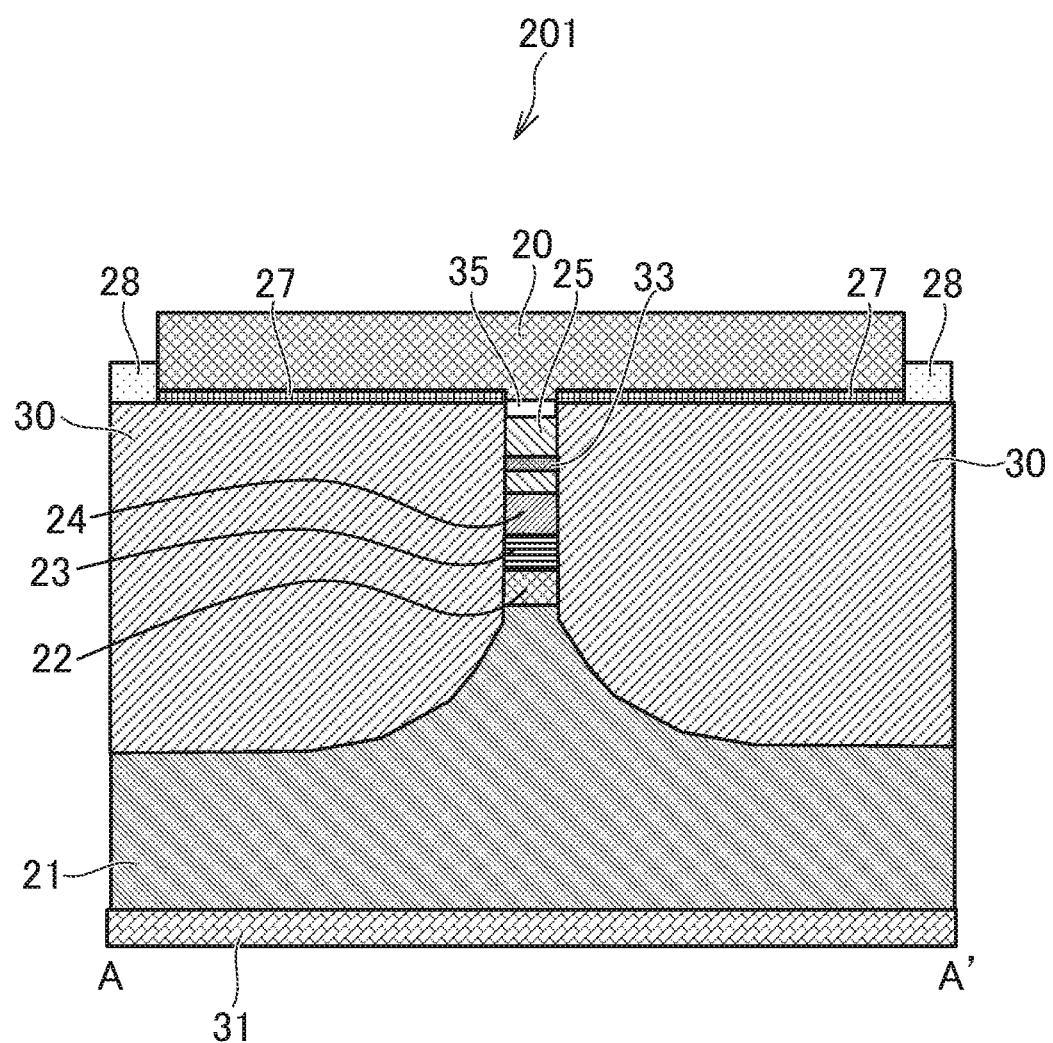
FIG. 4 is a schematic sectional view taken along the line A-A' of FIG. 1 of an optical semiconductor device according to a second example implementation of the present invention.

FIG. 4 is a schematic sectional view taken along the line A-A' of FIG. 1 of an optical semiconductor device 201 according to a second example implementation of the present invention. The difference from the first example implementation lies in that the insulating film in the first example implementation is integrally formed of a single material, whereas in the second example implementation, the insulating film 26 may include a first insulating layer formed in the thin region of the insulating film 26 and a second insulating layer formed in the thick region of the insulating film 26 with a material different from that for the first insulating layer. As illustrated in FIG. 4, the optical semiconductor device 201 according to the second example implementation may include a first insulating layer 27 that may be overlapped with the top electrode 20 and a second insulating layer 28 arranged in a region that is not overlapped with the top electrode 20. Here, the first insulating layer 27 and the second insulating layer 28 may be made of different materials from each other. For example, the first insulating layer 27 may be a silicon nitride film, and the second insulating layer 28 may be a silicon oxide film. Alternatively, the first insulating layer 27 may be a silicon oxide film, and the second insulating layer 28 may be a silicon nitride film. Still alternatively, any one of the first insulating layer 27 and the second insulating layer 28 may be made of aluminum oxide.

In the first example implementation, it may be desired to form two regions having different thicknesses in the insulating film 26 made of one material. There may be several production methods for forming two regions having different thicknesses. For example, there may be a method involving thinning only the region of the insulating film 26 formed to be thick, which may be overlapped with the top electrode 20, by etching. In the case of this production method, the etching amount depends on the etching time, and hence there may be a concern in that stable film thickness control may not be performed. Meanwhile, in the second example implementation, the region of the insulating film 26 that is overlapped with the top electrode 20 and the region of the insulating film 26 that is not overlapped therewith may be made of different materials. Because of this, the first insulating layer 27 and the second insulating layer 28 may be formed individually, and hence each of the insulating layers may be formed to a desired thickness. As a result, stable film thickness control may be performed. Needless to say, the effects described in the first example implementation may be obtained also in the second example implementation. In particular, the silicon nitride film may provide greater thermal conductivity than the silicon oxide film, and hence an optical semiconductor device that may provide greater heat dissipation may be provided by using the silicon nitride film as the first insulating layer 27 and the silicon oxide film as the second insulating layer 28. Similarly, the aluminum oxide film may provide greater thermal conductivity than the silicon oxide film, and hence the first insulating layer 27 may be made of aluminum oxide.

Figure 5:
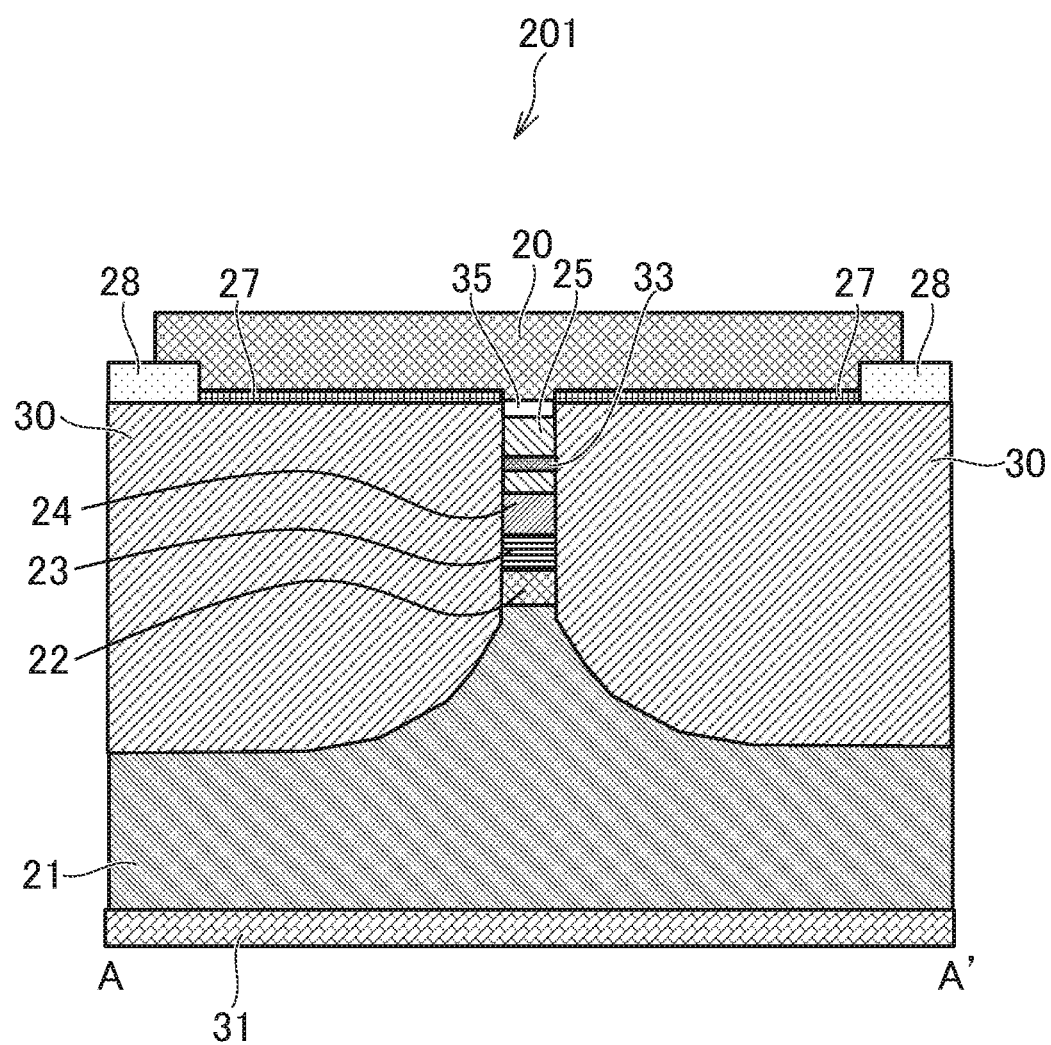
FIG. 5 is a schematic sectional view taken along the line A-A' of FIG. 1 of Modification Example 1 of the optical semiconductor device according to the second example implementation of the present invention.

FIG. 5 is a schematic sectional view taken along the line A-A' of FIG. 1 of Modification Example 1 of the optical semiconductor device 201. The difference from the foregoing lies in that a part of the second insulating layer 28 may be overlapped with the end portion of the top electrode 20. As described with reference to FIG. 3, it is may not be desired from the viewpoint of reliability that the thin first insulating layer 27 that is not overlapped with the top electrode 20 be exposed. According to Modification Example 1, the optical semiconductor device 201 excellence in manufacturability may be provided.

Figure 6:
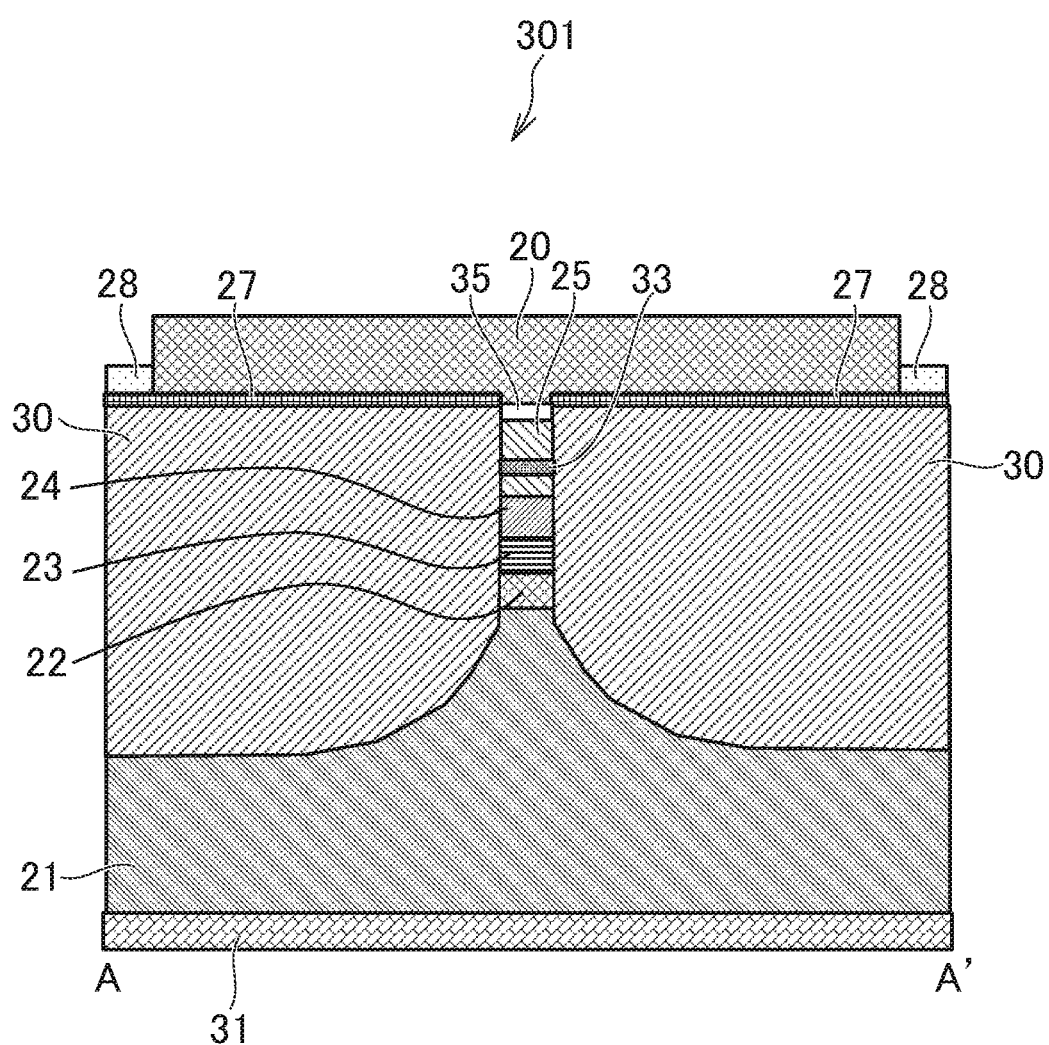
FIG. 6 is a schematic sectional view taken along the line A-A' of FIG. 1 of an optical semiconductor device according to a third example implementation of the present invention.

FIG. 6 is a schematic sectional view taken along the line A-A' of FIG. 1 of an optical semiconductor device 301 according to a third example implementation of the present invention. The difference from the second example implementation lies in that the first insulating layer 27 may be arranged up to a region that is not overlapped with the top electrode 20. As illustrated in FIG. 6, the first insulating layer 27 arranged in the region that is not overlapped with the top electrode 20 may be arranged under the second insulating layer 28. The second insulating layer 28 may be arranged in the region that is not overlapped with the top electrode 20. In the second example implementation, the position of the boundary between the first insulating layer 27 and the second insulating layer 28 may be influenced by manufacturing variations. In a manufacturing procedure of the structure illustrated in FIG. 5, for example, after the first insulating layer 27 is formed in a desired region, the region in which the first insulating layer 27 may be formed may be masked. Then, the second insulating layer 28 may be formed in a region that may not be masked. However, due to an alignment accuracy of the mask, the boundary of the region to be masked and the position of the end portion of the first insulating layer 27 may be displaced from each other. In the case of displacement, there may be a risk in that the second insulating layer 28 may not be formed, and the semiconductor layer (buried layer 30 in this case) may remain exposed. However, in this structure, the surface of the optical semiconductor device 301 may be covered with the first insulating layer 27, and hence the semiconductor layer may not be exposed even when the formation position of the second insulating layer 28 is displaced. Accordingly, an optical semiconductor device excellent in reliability may be provided. In addition, as a method involving removing only the second insulating layer 28 after continuously forming the first insulating layer 27 and the second insulating layer 28, the difference in rate of wet etching may be utilized. When an etchant having a high etching rate only with respect to the second insulating layer 28 is used, only the second insulating layer 28 under the top electrode 20 may be removed through use of a mask having a portion corresponding to the top electrode 20 opened. That is, as a mask for determining each shape of the second insulating layer 28 and the top electrode 20, the same mask may be used, which may be desired in manufacturability.

Figure 7:
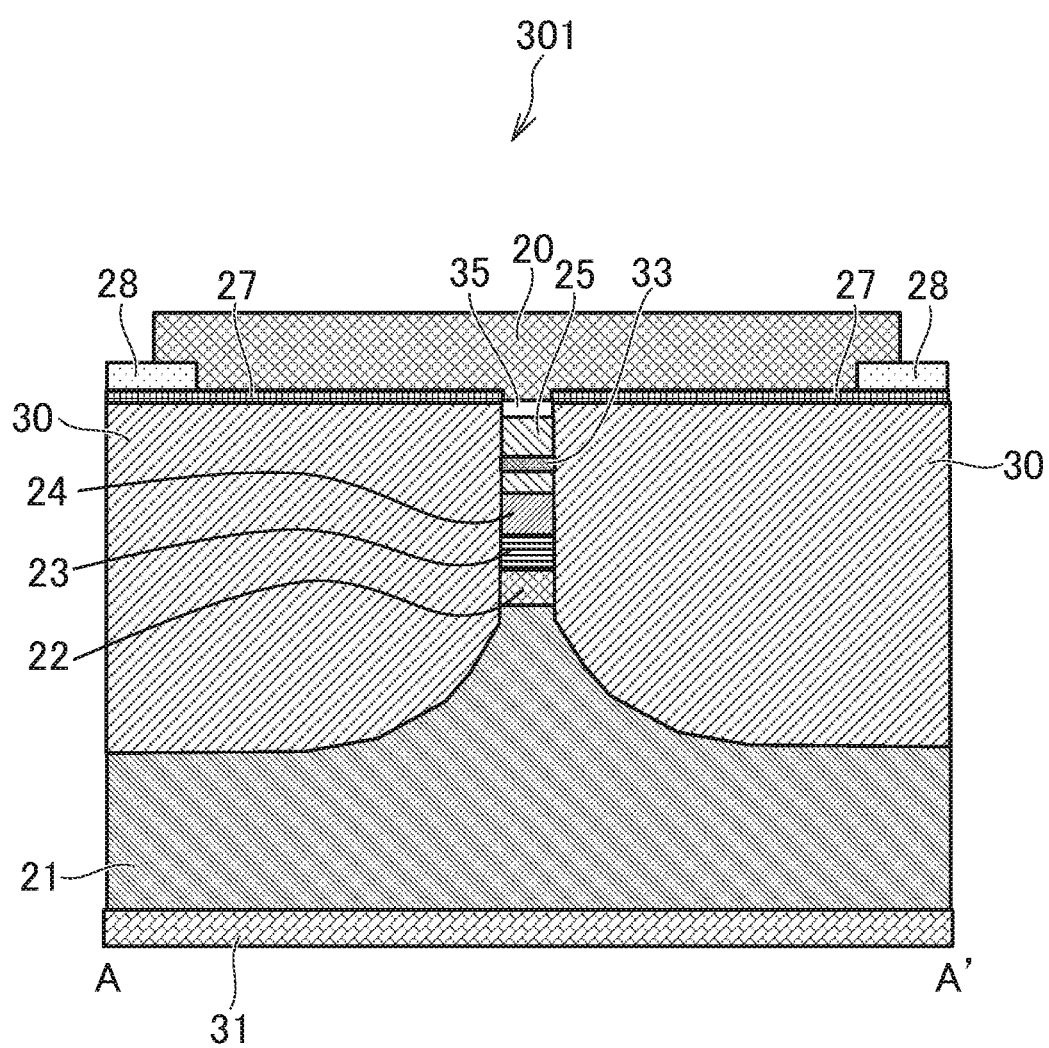
FIG. 7 is a schematic sectional view taken along the line A-A' of FIG. 1 of Modification Example 1 of the optical semiconductor device according to the third example implementation of the present invention.

FIG. 7 is a schematic sectional view taken along the line A-A' of FIG. 1 of Modification Example 1 of the optical semiconductor device 301 of the third example implementation. The difference from the foregoing lies in that a part of the second insulating layer 28 may be overlapped with the end portion of the top electrode 20. Also in the above-mentioned structure, there may be a concern in that a region in which the thin first insulating layer 27 may not be overlapped with any of the top electrode 20 and the second insulating layer 28 may occur due to the manufacturing variations. In Modification Example 1, in the same manner as in the above-mentioned effects, the thick second insulating layer 28 may be arranged in the region that is not covered with the top electrode 20, and as a result, an optical semiconductor device with excellence in reliability may be provided.

Figure 8:
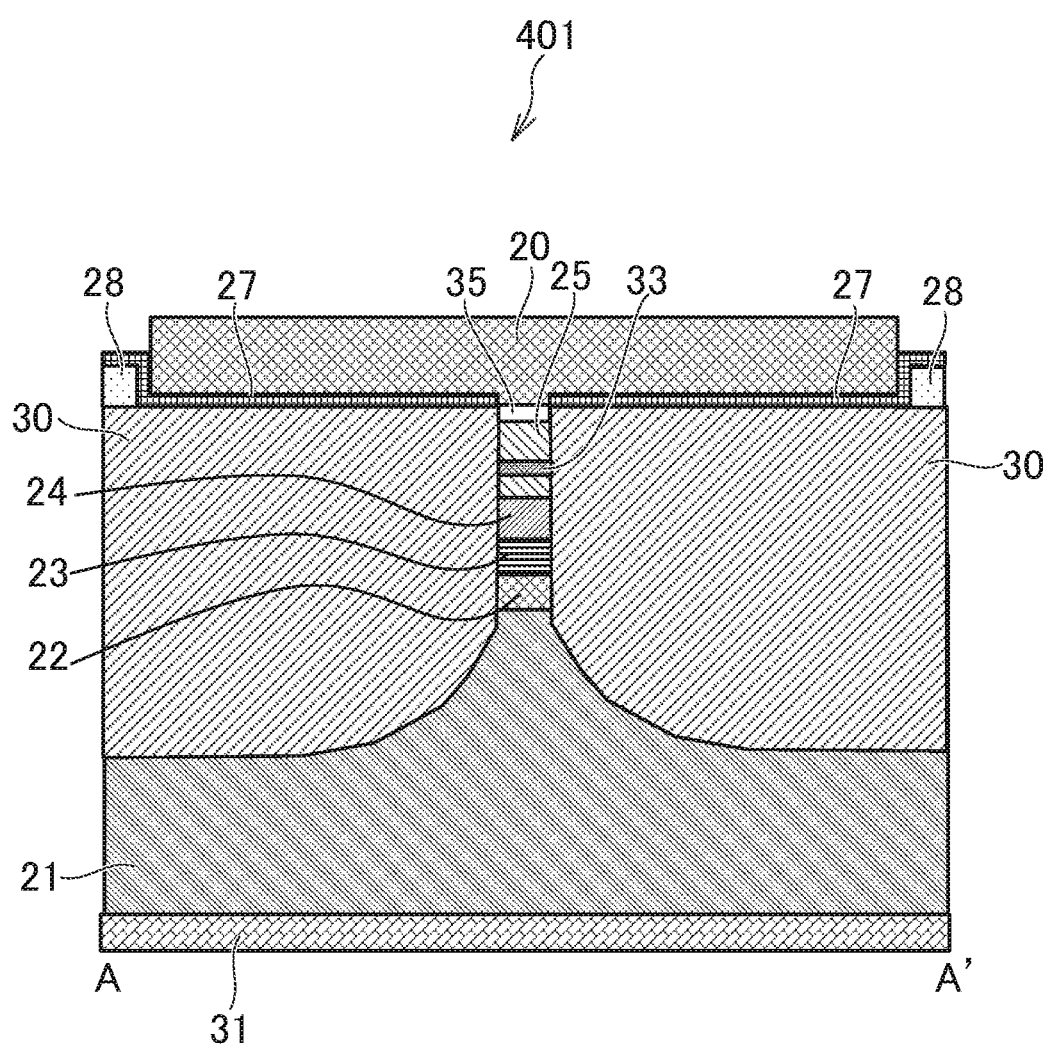
FIG. 8 is a schematic sectional view taken along the line A-A' of FIG. 1 of an optical semiconductor device according to a fourth example implementation of the present invention.

FIG. 8 is a schematic sectional view taken along the line A-A' of FIG. 1 of an optical semiconductor device 401 according to a fourth example implementation of the present invention. The difference from the third example implementation lies in that the first insulating layer 27 may be formed on the second insulating layer 28 in the region in which the insulating film 26 is not overlapped with the top electrode 20. Specifically, as illustrated in FIG. 8, the first insulating layer 27 arranged in the region that is not overlapped with the top electrode 20 may be arranged on the second insulating layer 28. According to this structure, a region in which the semiconductor layer (buried layer 30 in the fourth example implementation) is not covered with the insulating film 26 may be prevented from being formed in the same manner as in the third example implementation.

Figure 9:
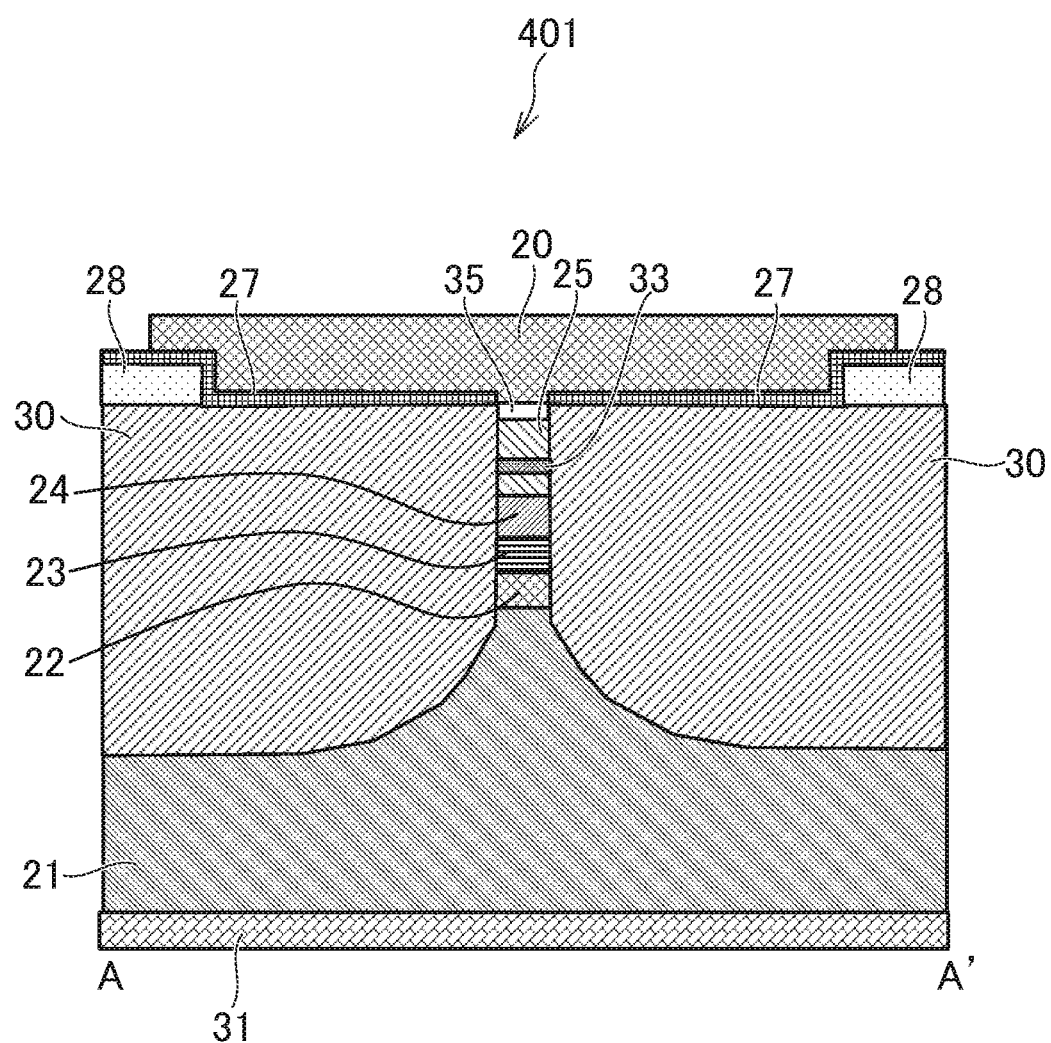
FIG. 9 is a schematic sectional view taken along the line A-A' of FIG. 1 of Modification Example 1 of the optical semiconductor device according to the fourth example implementation of the present invention.

FIG. 9 is a schematic sectional view taken along the line A-A' of FIG. 1 of Modification Example 1 of the optical semiconductor device 401 of the fourth example implementation. The difference from FIG. 8 lies in that a part of the second insulating layer 28 may be overlapped with the end portion of the top electrode 20. Also in the structure in the fourth example implementation, there may be a concern in that a region in which the thin first insulating layer 27 is not overlapped with any of the top electrode 20 and the second insulating layer 28 may occur due to manufacturing variations. In Modification Example 1, in the same manner as in the above-mentioned effects, the thick second insulating layer 28 may be arranged in the region in which the thin first insulating layer 27 is not covered with the top electrode 20, and as a result, an optical semiconductor device with excellence in reliability may be provided.

Figure 10:
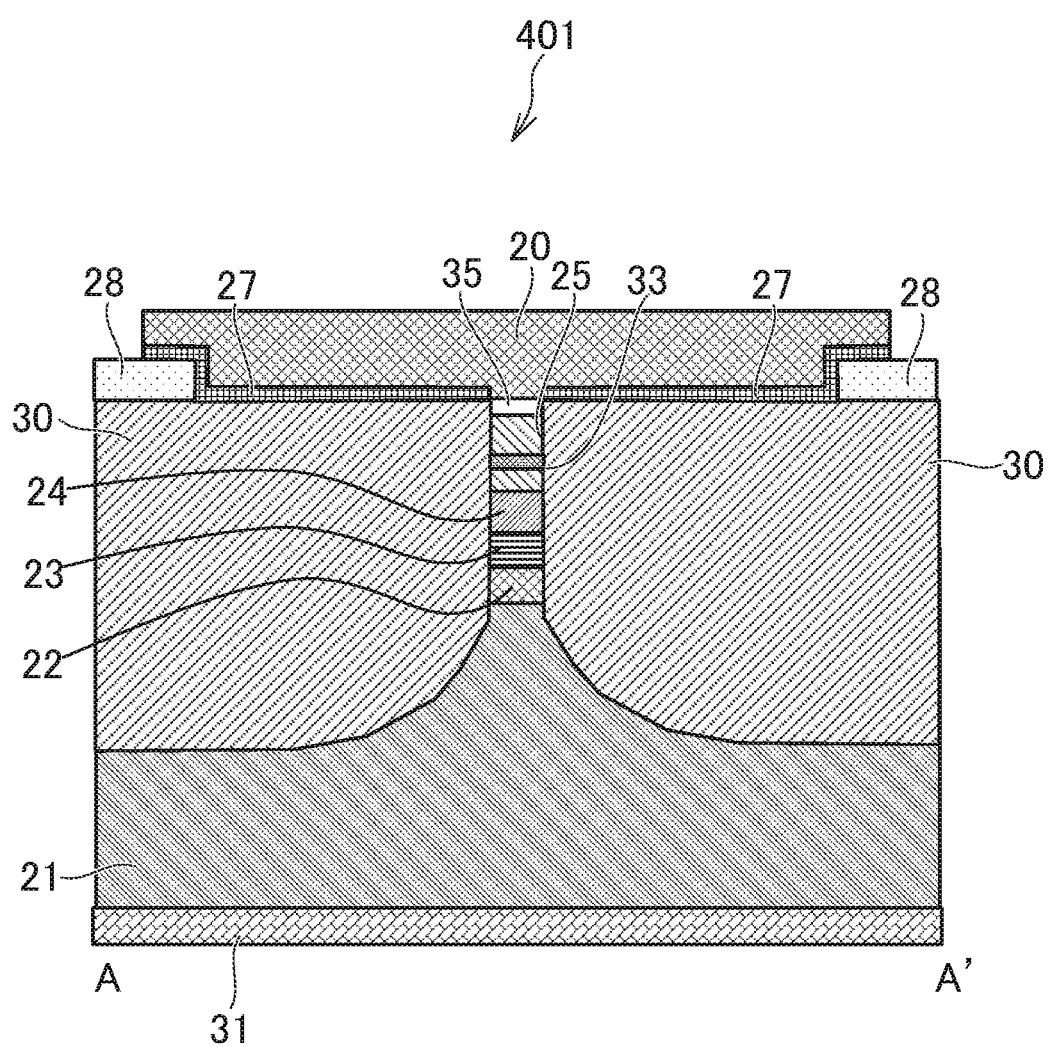
FIG. 10 is a schematic sectional view taken along the line A-A' of FIG. 1 of Modification Example 2 of the optical semiconductor device according to the fourth example implementation of the present invention.

FIG. 10 is a schematic sectional view taken along the line A-A' of FIG. 1 of Modification Example 2 of the optical semiconductor device 401 according to the fourth example implementation. The difference from FIG. 9 lies in that only the second insulating layer 28 may be formed in the region in which the insulating film 26 and the top electrode 20 are not overlapped with each other. That is, only the first insulating layer 27 may be formed under the top electrode 20 except for the vicinity of the end portion. Meanwhile, in the end portion of the top electrode 20, both the first insulating layer 27 and the second insulating layer 28 may be formed, and the first insulating layer 27 may be arranged on the second insulating layer 28. Only the second insulating layer 28 may be formed in the region that is not overlapped with the top electrode 20. There may be two merits of this configuration. One of the merits is advantageous from the viewpoint of stress. The insulating film 26 may serve as a stress factor with respect to the semiconductor layer. In general, stress may be larger when the thickness of a film is larger. In Modification Example 2, the thickness of the insulating film 26 in the region that is not overlapped with the top electrode 20 may be thinner than the thicknesses in FIG. 6 to FIG. 9. Accordingly, the generation of stress may be suppressed to the extent possible while the merit of providing a structure in which the surface of the semiconductor layer is securely covered with the insulating film 26 may be kept.

The second merit is stabilization of formation of the shape of the top electrode 20. As one of production methods for the top electrode 20, there may be a method involving forming an electrode on an entire surface and then removing an unnecessary region so as to have a desired shape. The manufacturing procedure of Modification Example 2 is as described below. First, each layer up to the semiconductor layer (that is, each layer up to the buried layer 30 and the contact layer 35) may be formed. Next, the second insulating layer 28 may be formed in a desired region. Then, the first insulating layer 27 may be formed on an entire surface. At this point, the first insulating layer 27 may be formed on the second insulating layer 28 also in a region that is not overlapped with the top electrode 20 later (same as the state without the top electrode 20 shown in FIG. 9). Next, an electrode may be formed on the entire surface of the first insulating layer 27. The method of forming the electrode may be, for example, a deposition method. Next, a region that is to be the top electrode 20 may be masked, and the electrode in a region that is not masked is may be removed. A milling method or the like may be used for removing the electrode. In this case, only the electrode may be removed so as to leave the first insulating layer 27, but there may be a risk in that a region in which the electrode cannot be sufficiently removed may occur due to variations in a wafer surface. As a result, there may be a risk in that the shape of the top electrode 20 may not be stable when viewed as a whole wafer. In view of the foregoing, the risk in that the electrode may remain may be securely eliminated by removing a larger amount to the extent that the first insulating layer 27 is also removed simultaneously with the removal of the electrode. In this case, a part of the second insulating layer 28 may also be removed, but there may be no problem as long as the second insulating layer 28 is also formed to be thick so that the thickness which finally functions as a protective film remains. Then, the second insulating layer 28 may be a region away from the stripe structure 3, and hence heat dissipation may be less influenced even when the second insulating layer 28 is somewhat thick. Thus, according to the structure of Modification Example 2, the following advantages may be obtained. First, when the insulating film 26 is formed so that a large part thereof in the region that is overlapped with the top electrode 20 includes only the thin first insulating layer 27, the heat dissipation may be improved, and the characteristics of the optical semiconductor device 401 may be improved. Further, when the insulating film 26 is formed so that the insulating film 26 in the region that is not overlapped with the top electrode 20 includes only the second insulating layer 28 that is thicker than the first insulating layer 27, the reliability may be improved. In addition, the first insulating layer 27 and the second insulating layer 28 may be overlapped with each other in the end portion of the second insulating layer 28, and hence a region in which the semiconductor layer (here, the buried layer 30) is not covered with the insulating film 26 due to the influence of the manufacturing variations may be prevented from being formed. Further, the formation of the shape of the top electrode 20 may be stabilized.

Figure 11:
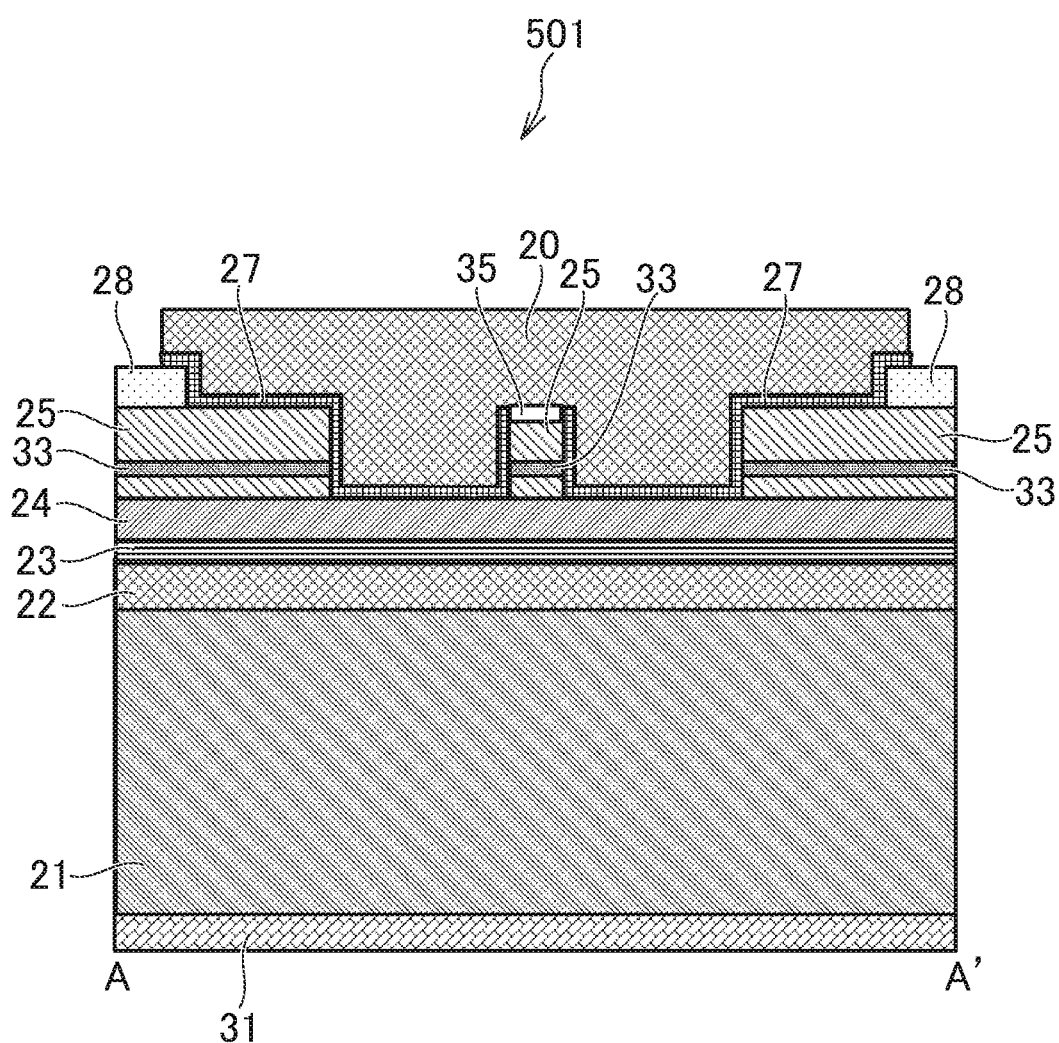
FIG. 11 is a schematic sectional view taken along the line A-A' of FIG. 1 of an optical semiconductor device according to a fifth example implementation of the present invention.

FIG. 11 is a schematic sectional view taken along the line A-A' of FIG. 1 of an optical semiconductor device 501 according to a fifth example implementation of the present invention. The difference of the fifth example implementation lies in that the first insulating layer 27 may be arranged on each side surface of the stripe structure 3. The optical semiconductor device 501 may be a ridge optical semiconductor device. The stripe structure 3 may be formed of the second conductivity type cladding layer 25 including the diffraction grating layer 33 and the contact layer 35. In addition, a similar semiconductor multilayer may be arranged on each side of the stripe structure 3. The first conductivity type optical confinement layer 22, the active layer 23, and the second conductivity type optical confinement layer 24 may be widely arranged on the substrate 21. In the same manner as in the other embodiments, in the vicinity of the stripe structure 3, the insulating film 26 overlapped with the top electrode 20 may include only the first insulating layer 27. In addition, the side surface of the stripe structure 3 may be also covered with the first insulating layer 27. In the region that is not overlapped with the top electrode 20, the insulating film 26 may include only the second insulating layer 28. In the vicinity of the end portion of the top electrode 20, the insulating film 26 may include the first insulating layer 27 and the second insulating layer 28. In the region close to the stripe structure 3, the insulating film 26 may include only the thin first insulating layer 27, and thus the optical semiconductor device 501 may provide excellence in heat dissipation. In addition, the structures of the above-mentioned other embodiments and modification examples may be applied to the configurations of the insulating film 26 in the end portion of the top electrode 20 and the region that is not covered with the top electrode 20.

Figure 12:
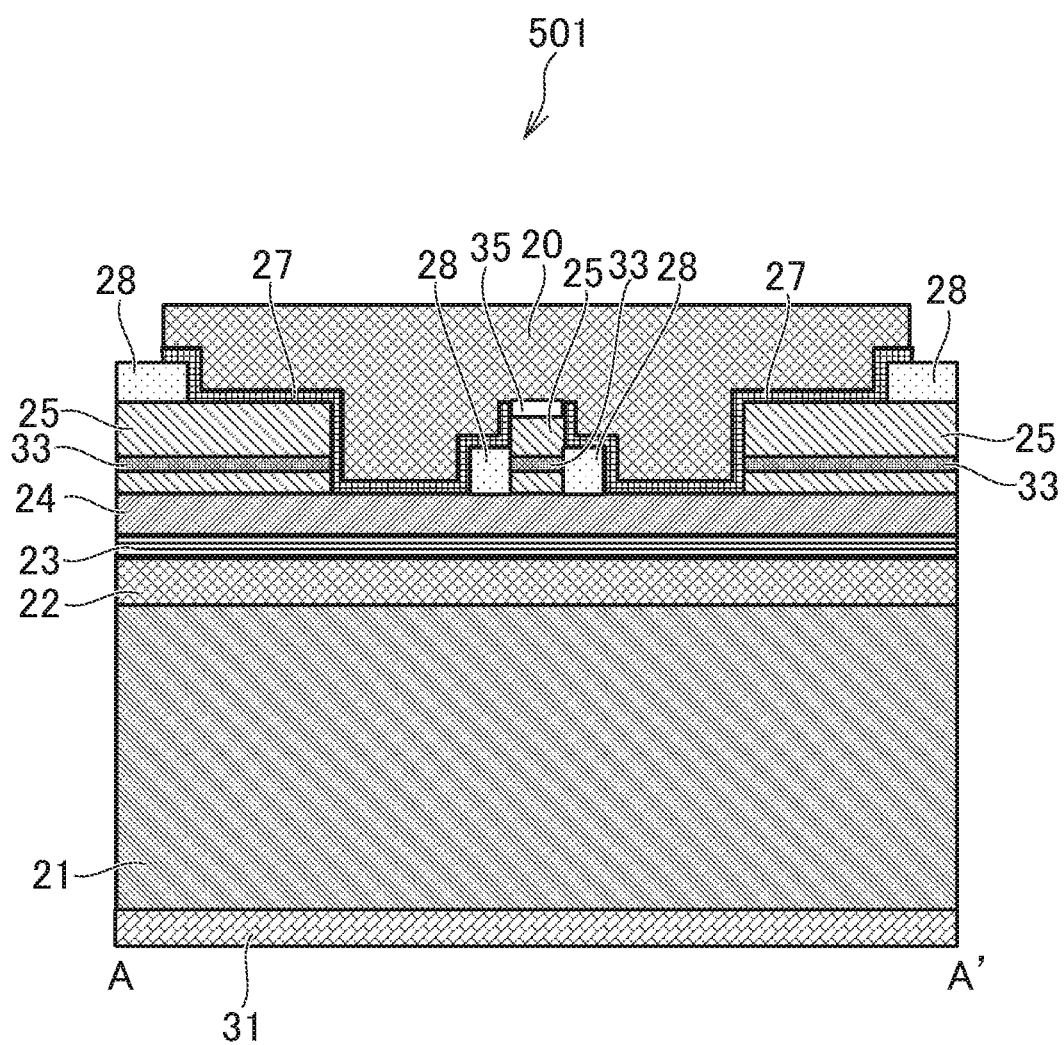
FIG. 12 is a schematic sectional view taken along the line A-A' of FIG. 1 of Modification Example 1 of the optical semiconductor device according to the fifth example implementation of the present invention.

FIG. 12 is a schematic sectional view taken along the line A-A' of FIG. 1 of Modification Example 1 of the optical semiconductor device 501 according to the fifth example implementation. The difference from FIG. 11 lies in that the second insulating layer 28 may be arranged also in a part of the side surface of the stripe structure 3. The feature of Modification Example 1 lies in that the second insulating layer 28 may be arranged between the side surface of the stripe structure 3 and the first insulating layer 27 in a lower portion of the side surface of the stripe structure 3. In the case of a related-art ridge optical semiconductor device, the insulating film 26 covering each side surface of the stripe structure 3 may have the same thickness between the region that is overlapped with the top electrode 20 and the region that is not overlapped therewith. Because of this, the insulating film 26 on the side surface of the stripe structure 3 may have a thickness enough to function as a protective layer. Accordingly, when the loss of a waveguide mode is taken into consideration, the seeping of the waveguide mode into the insulating film 26 may be sufficiently small in the boundary portion between the insulating film 26 and the top electrode 20. However, in the fifth example implementation, the insulating film 26 may be formed as a layer thinner than the protective layer in order to improve heat dissipation. As a result, the seeping of the waveguide mode into the top electrode 20 portion becomes large, and there may be a risk in that the loss of the waveguide mode may be increased. In view of the foregoing, in Modification Example 1, the insulating film 26 that covers the stripe structure 3 may be formed to be thick only on the active layer 23 side, which may be to be the center of light. Specifically, the side surface of the stripe structure 3 may have a structure in which a lower portion is covered with both the first insulating layer 27 and the second insulating layer 28, and an upper portion may be covered only with the first insulating layer 27. The second insulating layer 28 may have a thickness that functions as a protective layer, and hence the seeping of the waveguide mode into the top electrode 20 portion may be suppressed. Although the structure illustrated in FIG. 11 is superior from the viewpoint of heat dissipation, when the optical characteristics are also taken into consideration, Modification Example 1 may be superior. It may be only required to select any one of those structures in accordance with the operating temperature and the required characteristics. The width covered with the second insulating layer 28 on the side surface of the stripe structure 3 may be determined in accordance with the required characteristics. For example, when a half or more of the height of the stripe structure 3 is covered, the loss of the waveguide mode may be reduced. In addition, the entire side surface of the stripe structure 3 may be covered with the second insulating layer 28. Even with this structure, the region slightly distant from the stripe structure 3 may be covered only with the first insulating layer 27, and hence the effect of improving heat dissipation may be obtained.

The present invention is not limited to the embodiments described above, and various modifications may be made thereto. For example, the optical semiconductor device is not limited to the above-mentioned examples, and may be an electro-absorption modulator, an MZ modulator, an amplifier, or a light-receiving element. In the case of those optical semiconductor devices, the optical functional layer functions as an absorption layer.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An optical semiconductor device, comprising:
   a substrate;
   a semiconductor multilayer which is formed on the substrate, and includes an optical functional layer;
   an insulating film formed on the semiconductor multilayer; and
   an electrode formed on a part of the insulating film,
   wherein the insulating film covers the semiconductor multilayer except for a region in which the semiconductor multilayer and the electrode are electrically connected to each other,
   wherein at least a part of a region of the insulating film that is over the semiconductor multilayer and overlapped with the electrode is thinner than a region of the insulating film that is over the semiconductor multilayer and not overlapped with the electrode, and
   wherein the at least the part of the region of the insulating film that is overlapped with the electrode is proximate to and located above the semiconductor multilayer.

2. The optical semiconductor device according to claim 1, wherein a first region of the insulating film is overlapped with a part of an end portion of the electrode.

3. The optical semiconductor device according to claim 1, wherein the insulating film is integrally formed of a single material.

4. The optical semiconductor device according to claim 1, wherein the insulating film includes a first insulating layer formed in the at least the part of the region and a second insulating layer formed in another region with a material different from a material for the first insulating layer.

5. The optical semiconductor device according to claim 4, wherein the first insulating layer is arranged in the region of the insulation film that is over the semiconductor multilayer and not overlapped with the electrode.

6. The optical semiconductor device according to claim 5, wherein the first insulating layer arranged in the region of the insulating film that is over the semiconductor multilayer and not overlapped with the electrode is arranged under the second insulating layer.

7. The optical semiconductor device according to claim 5, wherein the first insulating layer is arranged on the second insulating layer.

8. The optical semiconductor device according to claim 7, wherein the first insulating layer is arranged on the second insulating layer in an end portion of the electrode.

9. The optical semiconductor device according to claim 1, wherein the semiconductor multilayer includes a stripe structure and a buried layer formed on each side of the stripe structure.

10. The optical semiconductor device according to claim 4,
    wherein the semiconductor multilayer includes a stripe structure, and
    wherein the first insulating layer is arranged on each side surface of the stripe structure.

11. The optical semiconductor device according to claim 10, wherein the second insulating layer is arranged between the side surface of the stripe structure and the first insulating layer in a portion of the side surface of the stripe structure.

12. The optical semiconductor device according to claim 1, wherein the at least the part of the region includes one of a silicon nitride film or an aluminum oxide film.

13. The optical semiconductor device according to claim 1, wherein a thick region of the insulating film includes a silicon oxide film.

14. A method of forming an optical semiconductor device, comprising:
　forming a semiconductor multilayer on a substrate, the semiconductor multilayer including an optical functional layer;
　forming an insulating film on the semiconductor multilayer; and
　forming an electrode on a part of the insulating film,
　　wherein the insulating film covers the semiconductor multilayer except for a region in which the semiconductor multilayer and the electrode are electrically connected to each other,
　　wherein at least a part of a region of the insulating film that is overlapped with the electrode is thinner than another region of the insulating film that is not overlapped with the electrode, and
　　wherein the at least the part of the region of the insulating film that is overlapped with the electrode is proximate to and located above the semiconductor multilayer.

15. The method of claim 14, wherein another region of the insulating film is overlapped with a part of an end portion of the electrode.

16. The method of claim 14, wherein the insulating film is integrally formed of a single material.

17. The method of claim 14, wherein forming the insulating film comprises:
　forming a first insulating layer in the at least the part of the region; and
　forming a second insulating layer in the other region with a material different from a material for the first insulating layer.

18. The method of claim 17, wherein forming the first insulating layer comprises:
　forming the first insulating layer in the other region.

19. The method of claim 18, wherein forming the second insulating layer comprises:
　forming the second insulating layer on the first insulating layer.

20. The method of claim 18, wherein forming the first insulating layer comprises:
　forming the first insulating layer on the second insulating layer.

* * * * *